(12) United States Patent
Hung et al.

(10) Patent No.: US 10,541,485 B2
(45) Date of Patent: Jan. 21, 2020

(54) ON-BOARD DIAGNOSTIC SYSTEM AND TERMINAL AND MANUFACTURING METHOD THEREOF

(71) Applicant: Wistron NeWeb Corp., Hsinchu (TW)

(72) Inventors: Tien-Chun Hung, Hsinchu (TW); Guo-Cheng Tsai, Hsinchu (TW); Cheng-Huang Chen, Hsinchu (TW)

(73) Assignee: WISTRON NEWEB CORP., Hsinchu (TW)

(*) Notice: Subject to any disclaimer, the term of this patent is extended or adjusted under 35 U.S.C. 154(b) by 0 days.

(21) Appl. No.: 16/246,669

(22) Filed: Jan. 14, 2019

(65) Prior Publication Data

US 2019/0245290 A1 Aug. 8, 2019

(30) Foreign Application Priority Data

Feb. 2, 2018 (TW) .............................. 107103784 A

(51) Int. Cl.
*H01R 12/72* (2011.01)
*H01R 12/58* (2011.01)
*G01R 31/28* (2006.01)
*H01R 12/55* (2011.01)
*H01R 12/70* (2011.01)
*H01R 13/405* (2006.01)
(Continued)

(52) U.S. Cl.
CPC ....... *H01R 12/724* (2013.01); *G01R 31/2818* (2013.01); *H01R 12/55* (2013.01); *H01R 12/58* (2013.01); *H01R 12/7005* (2013.01); *H01R 13/405* (2013.01); *H01R 43/0256* (2013.01); *H01R 43/24* (2013.01); *H05K 1/144* (2013.01)

(58) Field of Classification Search
CPC .................................................. H01R 12/724
See application file for complete search history.

(56) References Cited

U.S. PATENT DOCUMENTS 7,931,480 B2 * 4/2011 Zhu ...................... H01R 12/725
439/78
8,079,854 B2 * 12/2011 He .......................... H01R 24/60
439/108
(Continued)

FOREIGN PATENT DOCUMENTS

EP 0 204 504 A2 12/1986

OTHER PUBLICATIONS

European Search Report dated Jun. 26, 2019, issued in application No. EP 19154403.0.

*Primary Examiner* — Ross N Gushi
(74) *Attorney, Agent, or Firm* — McClure, Qualey & Rodack, LLP

(57) ABSTRACT

An on-board diagnostic connector terminal is provided, including a plurality of first pins, a plurality of second pins and a substrate. Each first pin includes a first section and a second section. The first section connects to the second section. The first section includes a first connection end, and the second section includes a first soldering end. Each second pin includes a second connection end and a second soldering end. The first pins and the second pins are disposed on the substrate. The first soldering ends and the second soldering ends are arranged on a first straight line. At least one first connection end and the second connection end corresponding thereto are arranged linearly in a first direction. The first direction is perpendicular to the first straight line.

15 Claims, 10 Drawing Sheets

(51) Int. Cl.
*H01R 43/02* (2006.01)
*H01R 43/24* (2006.01)
H05K 1/14 (2006.01)

(56) References Cited

U.S. PATENT DOCUMENTS

| | | | | |
|---|---|---|---|---|
| 8,662,936 | B2* | 3/2014 | Chung | H01R 24/00 |
| | | | | 439/607.35 |
| 9,136,623 | B2* | 9/2015 | Hamada | H01R 12/724 |
| 9,136,649 | B2* | 9/2015 | Shih | H01R 13/658 |
| 9,368,927 | B2* | 6/2016 | Kawamura | H01R 24/60 |
| 9,496,651 | B2* | 11/2016 | Jeong | H01R 13/665 |
| 9,548,569 | B2* | 1/2017 | Tanaka | H01R 13/646 |
| 9,601,883 | B1* | 3/2017 | Chung | H01R 13/6461 |
| 9,634,425 | B1* | 4/2017 | Hsu | H01R 13/5202 |
| 9,780,496 | B2* | 10/2017 | Guo | H01R 13/405 |
| 9,899,755 | B2* | 2/2018 | Yamada | H01R 12/716 |
| 10,044,125 | B2* | 8/2018 | Qiu | H01R 12/7088 |
| 10,096,948 | B2* | 10/2018 | Yu | H01R 13/6581 |
| 10,153,566 | B2* | 12/2018 | Zhang | H01R 12/55 |
| 2007/0197064 | A1* | 8/2007 | Masumoto | H01R 12/725 |
| | | | | 439/108 |
| 2008/0160823 | A1* | 7/2008 | Jocham | H01R 13/533 |
| | | | | 439/404 |
| 2009/0186528 | A1* | 7/2009 | Chen | H01R 13/6477 |
| | | | | 439/660 |
| 2012/0178299 | A1 | 7/2012 | Neibaur et al. | |
| 2015/0171529 | A1 | 6/2015 | Tu et al. | |

* cited by examiner

A plurality of first pins are provided. Each first pin is integrally formed, each first pin comprises a first section and a second section, the first section is connected and perpendicular to the second section, the first section comprises a first connection end, and the second section comprises a first soldering end. ~S1

A plurality of second pins are provided. Each second pin is integrally formed, and each second pin comprises a second connection end and a second soldering end. ~S2

A mold is provided. The mold comprises a plurality of abutting pins, the first pins and the second pins are partially clipped in the mold, and the abutting pins hold the second sections. ~S3

The first pins and the second pins are embedded in a substrate by injection molding, wherein the first soldering ends and the second soldering ends are arranged on a first straight line. ~S4

The mold is removed from the substrate, and the abutting pins thereby form a plurality of openings on the substrate while the abutting pins, i.e. the mold, have been removed. ~S5

FIG. 3

ON-BOARD DIAGNOSTIC SYSTEM AND TERMINAL AND MANUFACTURING METHOD THEREOF

CROSS REFERENCE TO RELATED APPLICATIONS

This Application claims priority of Taiwan Patent Application No. 107103784, filed on Feb. 2, 2018, the entirety of which is incorporated by reference herein.

BACKGROUND OF THE INVENTION

Field of the Invention

The present invention relates to an on-board diagnostic system, and in particular to an on-board diagnostic connector terminal.

Description of the Related Art

One of the conventional on-board diagnostic systems includes a plurality of first pins, a plurality of second pins and a circuit board. The first pins and the second pins are inserted directly into the circuit board, and are soldered to the circuit board. The circuit board must be perpendicular to the first pins and the second pins. The size of the circuit board cannot be reduced, and the space inside the on-board diagnostic system is occupied by the circuit board.

In another conventional on-board diagnostic system, the first pins and the second pins are connected to the circuit board by an adapter board. However, the first pins and the second pins cannot be closely arranged, the mounting space on the circuit board is occupied thereby, and the size of the on-board diagnostic system is increased.

BRIEF SUMMARY OF THE INVENTION

In one embodiment, an on-board diagnostic connector terminal of the embodiment of the invention is provided, including a plurality of first pins, a plurality of second pins and a substrate. Each first pin is integrally formed, each first pin comprises a first section and a second section, the first section connects to the second section and is perpendicular to the second section, the first section comprises a first connection end, and the second section comprises a first soldering end. Each second pin is integrally formed, each second pin comprises a second connection end and a second soldering end, and at least one of the first connection ends respectively correspond to at least one of the second connection ends. The first pins and the second pins are disposed on the substrate, each first pin is partially embedded in the substrate, and each second pin is partially embedded in the substrate. The first soldering ends and the second soldering ends are arranged on a first straight line, at least one first connection ends and the second connection end corresponding thereto are arranged linearly in a first direction, and the first direction is perpendicular to the first straight line.

In one embodiment, a method for manufacturing an on-board diagnostic connector terminal is provided, including the following steps. First, a plurality of first pins are provided. Each first pin is integrally formed, each first pin comprises a first section and a second section, the first section connects to the second section and is perpendicular to the second section, the first section comprises a first connection end, and the second section comprises a first soldering end. Next, a plurality of second pins are provided. Each second pin is integrally formed, and each second pin comprises a second connection end and a second soldering end. Then, a mold is provided. The mold comprises a plurality of abutting pins, the first pins and the second pins are partially clipped in the mold, and the abutting pins hold the second sections. Next, the first pins and the second pins are embedded in a substrate by injection molding, wherein the first soldering ends and the second soldering ends are arranged on a first straight line, the substrate is formed in the mold by injection molding, and the abutting pins form a plurality of openings on the substrate.

In one embodiment, an on-board diagnostic system is provided. The on-board diagnostic system includes a housing, a circuit board and an on-board diagnostic connector terminal. The circuit board is disposed in the housing. The on-board diagnostic connector terminal is electrically connected to the circuit board. The on-board diagnostic connector terminal comprises a plurality of first pins, a plurality of second pins and a substrate. Each first pin is integrally formed, each first pin comprises a first section and a second section, the first section connects to the second section and is perpendicular to the second section, the first section comprises a first connection end, and the second section comprises a first soldering end. Each second pin is integrally formed, each second pin comprises a second connection end and a second soldering end, and at least one of the first connection ends respectively correspond to at least one of the second connection ends. The first pins and the second pins are disposed on the substrate, each first pin is partially embedded in the substrate, and each second pin is partially embedded in the substrate, wherein the first soldering ends and the second soldering ends are arranged on a first straight line, at least one first connection ends and the second connection end corresponding thereto are arranged linearly in a first direction, and the first direction is perpendicular to the first straight line.

Utilizing the on-board diagnostic connector terminal of the embodiment of the invention, the first soldering ends and the second soldering ends are alternately arranged on the first straight line, and the mounting space on the circuit board is reduced, and the size of the product is decreased. Additionally, each first pin is integrally formed, and each second pin is integrally formed. Each first pin is embedded in the substrate except the first connection end and the first soldering end. Each second pin is embedded in the substrate except the second connection end and the second soldering end. The on-board diagnostic connector terminal of the embodiment of the invention therefore has increased strength.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 3 shows a method for manufacturing an on-board diagnostic connector terminal of the embodiment of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
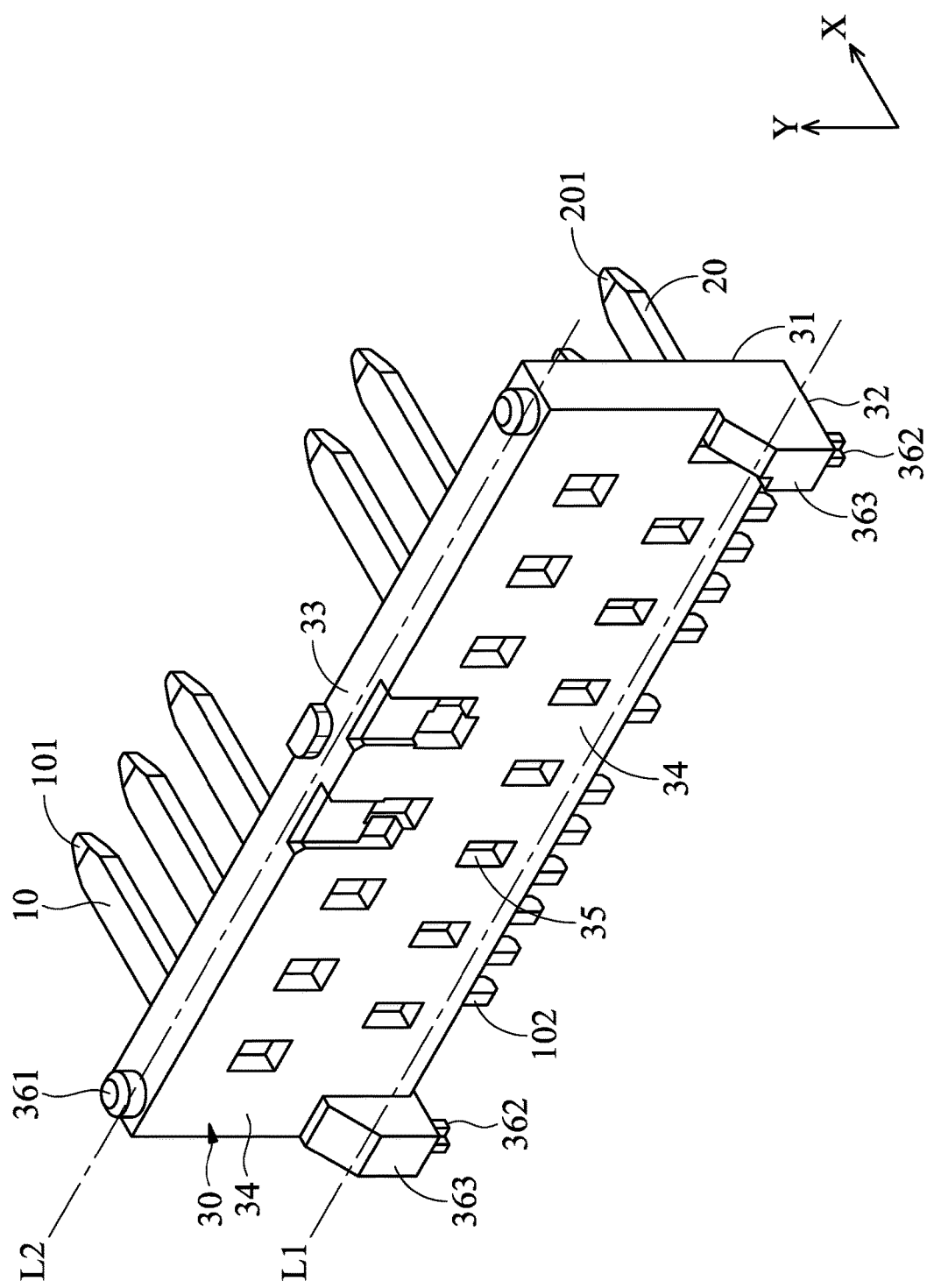
FIG. 1A is a perspective view of an on-board diagnostic connector terminal of an embodiment of the invention.
Figure 1B:
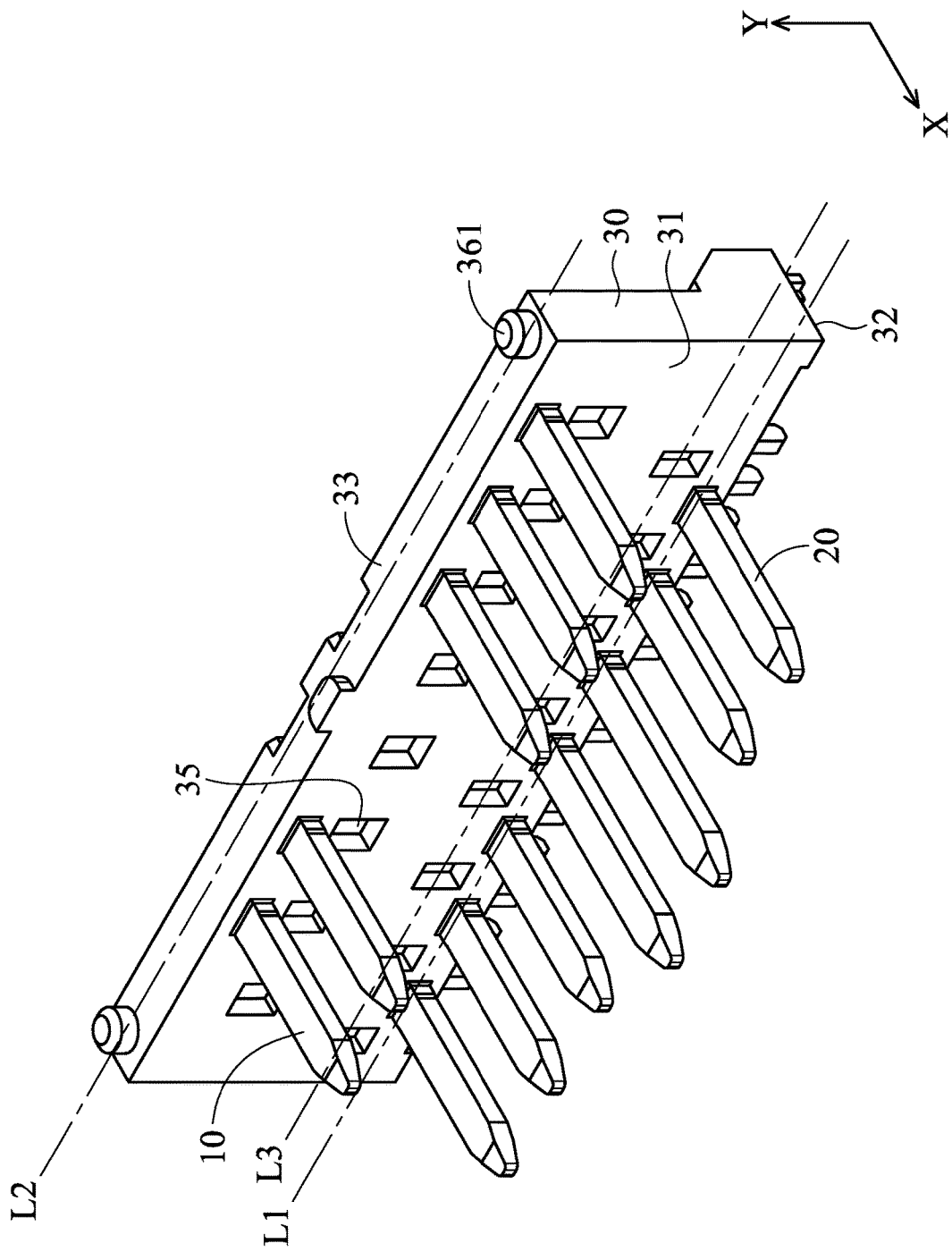
FIG. 1B is a perspective view of the on-board diagnostic connector terminal of the embodiment of the invention of another view angle.
Figure 1C:
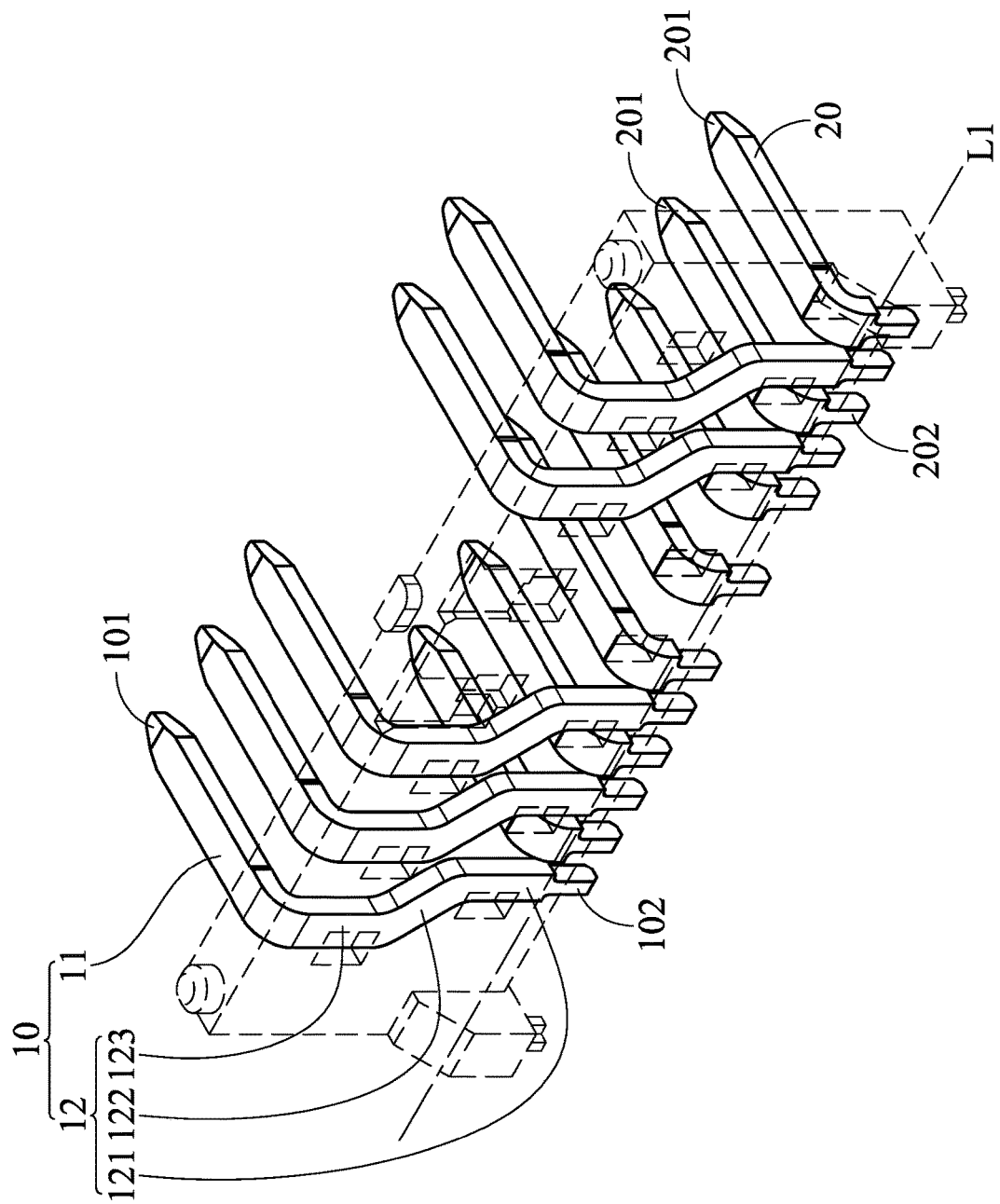
FIG. 1C shows the first pins and the second pins of the embodiment of the invention are partially embedded in the substrate.

FIG. 1A is a perspective view of an on-board diagnostic connector terminal 1 of an embodiment of the invention. FIG. 1B is another perspective view of the on-board diagnostic connector terminal 1 of the embodiment of the invention of another view angle. With reference to FIGS. 1A and 1B, the on-board diagnostic connector terminal 1 of the embodiment of the invention includes a plurality of first pins 10, a plurality of second pins 20 and a substrate 30. FIG. 1C shows that the first pins 10 and the second pins 20 are partially embedded in the substrate 30. Each first pin 10 is integrally formed. Each first pin 10 comprises a first section 11 and a second section 12. The first section 11 connects to the second section 12 and is perpendicular to the second section 12. The first section 11 comprises a first connection end 101, and the second section 12 comprises a first soldering end 102. Each second pin 20 is integrally formed. Each second pin 20 comprises a second connection end 201 and a second soldering end 202. The first connection ends 101 respectively correspond to the second connection ends 201, meaning that the first connection ends 101 and the second connection ends 201 projected on a first projection plane are aligned along a first direction Y;. The first pins 10 and the second pins 20 are disposed on the substrate. Each first pin 10 is partially embedded in the substrate, and each second pin 20 is partially embedded in the substrate 30. The first soldering ends 102 and the second soldering ends 202 are arranged on a first straight line L1. The first direction Y is perpendicular to the first straight line L1.

In the embodiment above, the substrate 30 is formed by injection molding. Each first pin is 10 partially embedded in the substrate, and each second pin 20 is partially embedded in the substrate 30. However, the disclosure is not meant to restrict the invention, in other embodiment, the substrate 30 can be formed by other processes.

Figure 1D:
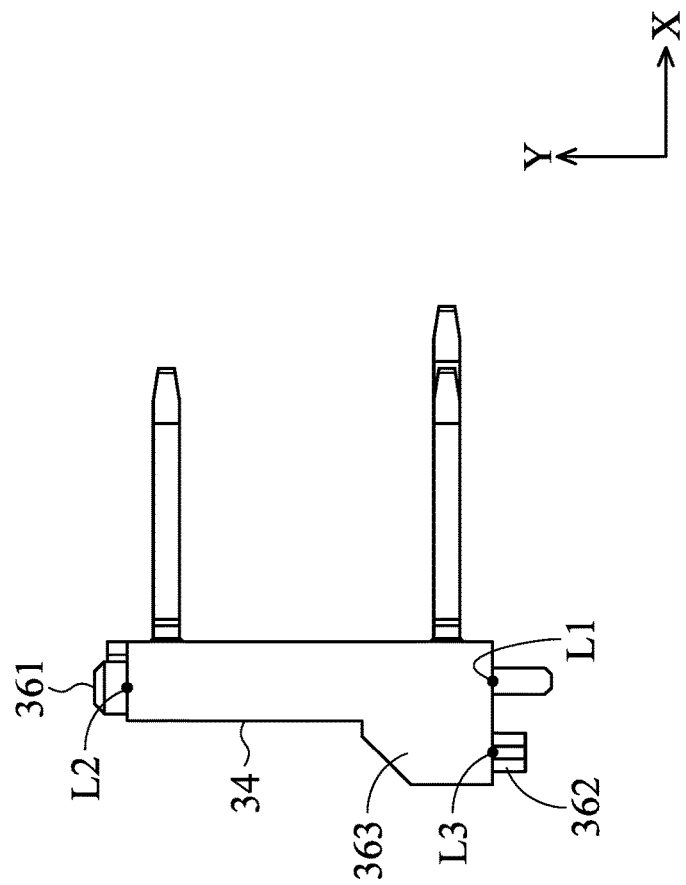
FIG. 1D is a side view of the on-board diagnostic connector terminal of the embodiment of the invention.
Figure 1E:
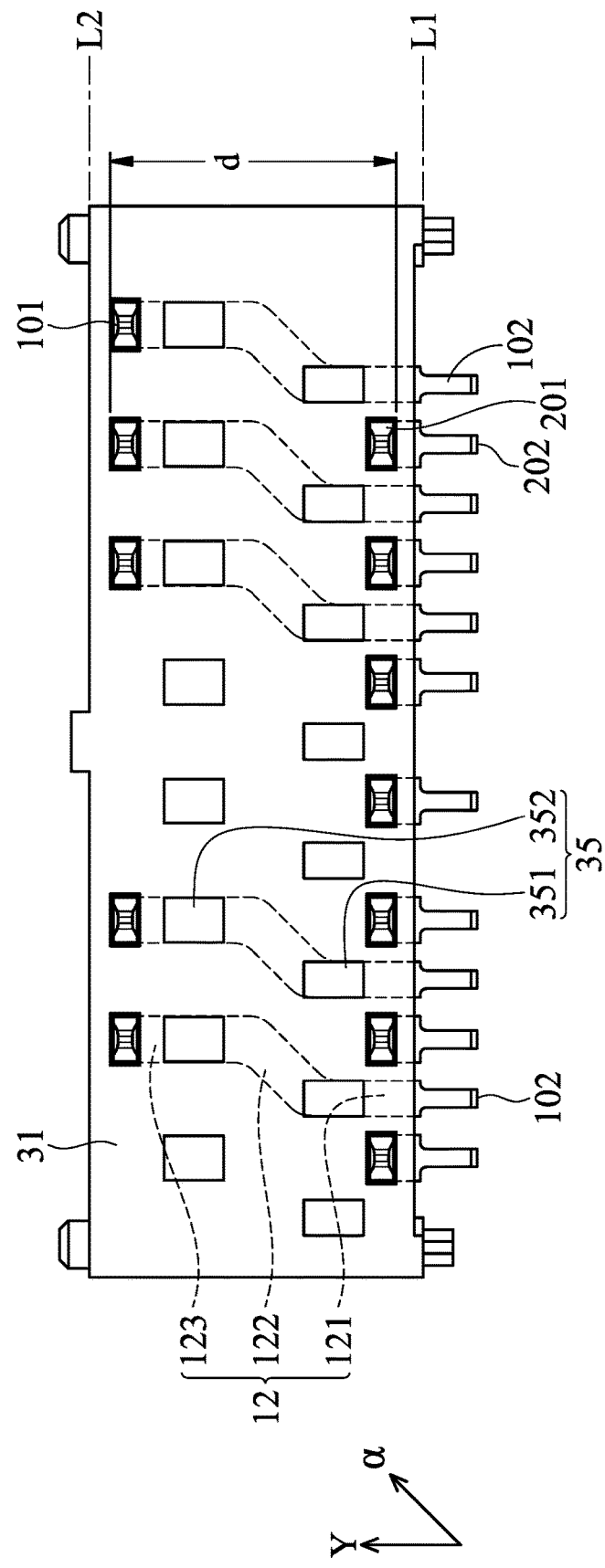
FIG. 1E is a front view of the on-board diagnostic connector terminal of the embodiment of the invention.

FIG. 1D is a side view of the on-board diagnostic connector terminal 1 of the embodiment of the invention. FIG. 1E is a front view of the on-board diagnostic connector terminal 1 of the embodiment of the invention. With reference to FIGS. 1C, 1D and 1E, in this embodiment, the first soldering ends 102 and the second soldering ends 202 are alternately arranged on the first straight line L1.

Utilizing the on-board diagnostic connector terminal 1 of the embodiment of the invention, the first soldering ends 102 and the second soldering ends 202 are alternately arranged on the first straight line L1, so that the mounting space on the circuit board is significantly reduced, thereby miniaturizing the product. Additionally, each first pin 10 is integrally formed, and each second pin 20 is integrally formed. Each first pin 10 is embedded in the substrate except the first connection end 101 and the first soldering end 102. Each second pin 20 is embedded in the substrate except the second connection end 201 and the second soldering end 202. By increasing the substrate-embedded proportion of the on-board diagnostic connector terminal 1 of the embodiment of the invention, the structural rigidity is thereby increased.

With reference to FIGS. 1A, 1B and 1C, in one embodiment, the substrate 30 comprises a first surface 31 and a second surface 32. The first surface 31 is perpendicular to the second surface 32. The first connection ends 101 and the second connection ends 201 protrude on the first surface 31. The first soldering ends 102 and the second soldering ends 202 protrude from the second surface 32.

With reference to FIGS. 1C and 1E, in one embodiment, each second section 12 comprises a first extending portion 121, a second extending portion 122 and a third extending portion 123. The first extending portion 121 connects the first soldering end 102 to the second extending portion 122. The second extending portion 122 connects the first extending portion 121 to the third extending portion 123. The third extending portion 123 connects the second extending portion 122 to the first section 11. The first extending portion 121 and the third extending portion 123 extend in the first direction Y. More specifically, an extension line of the first extending portion 121 and an extension line of the third extending portion 123 are parallel and separated from each other on the first projection plane. The second extending portion 122 extends in a second direction α, and the second directionα differs from the first direction Y (FIG. 1E).

With reference to FIG. 1E, in one embodiment, the substrate 30 comprises a plurality of openings 35, and the second section 12 is exposed in the openings 35. In this embodiment, the openings 35 include a plurality of first openings 351 and a plurality of second openings 352. The first openings 351 correspond to the first extending portions 121, and the second openings 352 correspond to the third extending portions 123. When the substrate 30 is formed by injection molding, the mold comprises a plurality of abutting pins. The abutting pins hold the second sections 12 to prevent the second sections 12 from being displaced while plastic materials are being injected, and to improve the reliability of the on-board diagnostic connector terminal. After the substrate 30 is formed, the mold is removed, and the abutting pins form the openings 35 on the substrate 30 (where the abutting pins abut the second sections 12). With reference to FIGS. 1A, 1B and 1E, the openings 35 are formed on the first surface 31 and a fourth surface 34 of the substrate 30.

With reference to FIG. 1E, in one embodiment, a gap d is formed between a top surface of one of the first connection end 101 and a bottom surface of the second connection end 201 corresponding thereto. The portion of the second section 12 embedded inside the substrate 30 has an embedded length (the sum of the length of the first extending portion 121, the second extending portion 122, and the third extending portion 123). The embedded length is greater than the gap d. The first soldering ends 102 and the second soldering ends 202 are alternately arranged on the first straight line L1. However, the disclosure is not meant to restrict the invention, the design of the first soldering ends 102 and the second soldering ends 202 being alternately arranged on the first straight line L1 can be realized by other means.

With reference to FIGS. 1A and 1B, in one embodiment, the substrate 30 further comprises a third surface 33 and a plurality of first positioning protrusions 361. The third surface 33 is opposite to the second surface 32. The first positioning protrusions 361 are formed on the third surface 33.

With reference to FIGS. 1A, 1B and 1D, in one embodiment, the first positioning protrusions 361 are arranged on a second straight line L2, and the first straight line L1 is parallel to the second straight line L2.

With reference to FIGS. 1A, 1B and 1D, in one embodiment, the substrate 30 further comprises the fourth surface 34 and a plurality of positioning blocks 363. The fourth surface 34 is opposite to the first surface 31. The positioning blocks 363 are formed on the fourth surface 34. Each positioning block 363 comprises a second positioning protrusion 362. The first positioning protrusions 361 protrude in a first protruding direction, and the second positioning protrusions 62 protrude in a second protruding direction opposite to the first protruding direction.

With reference to FIGS. 1A, 1B and 1D, in one embodiment, the second positioning protrusions 362 are arranged on a third straight line L. The first connection ends 101 and the second connection ends 201 extend in a third direction X. The third direction X is perpendicular to the first direction Y. In some embodiments, the third straight line L3 overlaps the first straight line L1 on a projection plane in the third direction X. In addition, the third straight line L3 separates from the second straight line L2 on a projection plane in the first direction Y, thereby balancing the on-board diagnostic connector terminal while being in a standing orientation.

Figure 2:
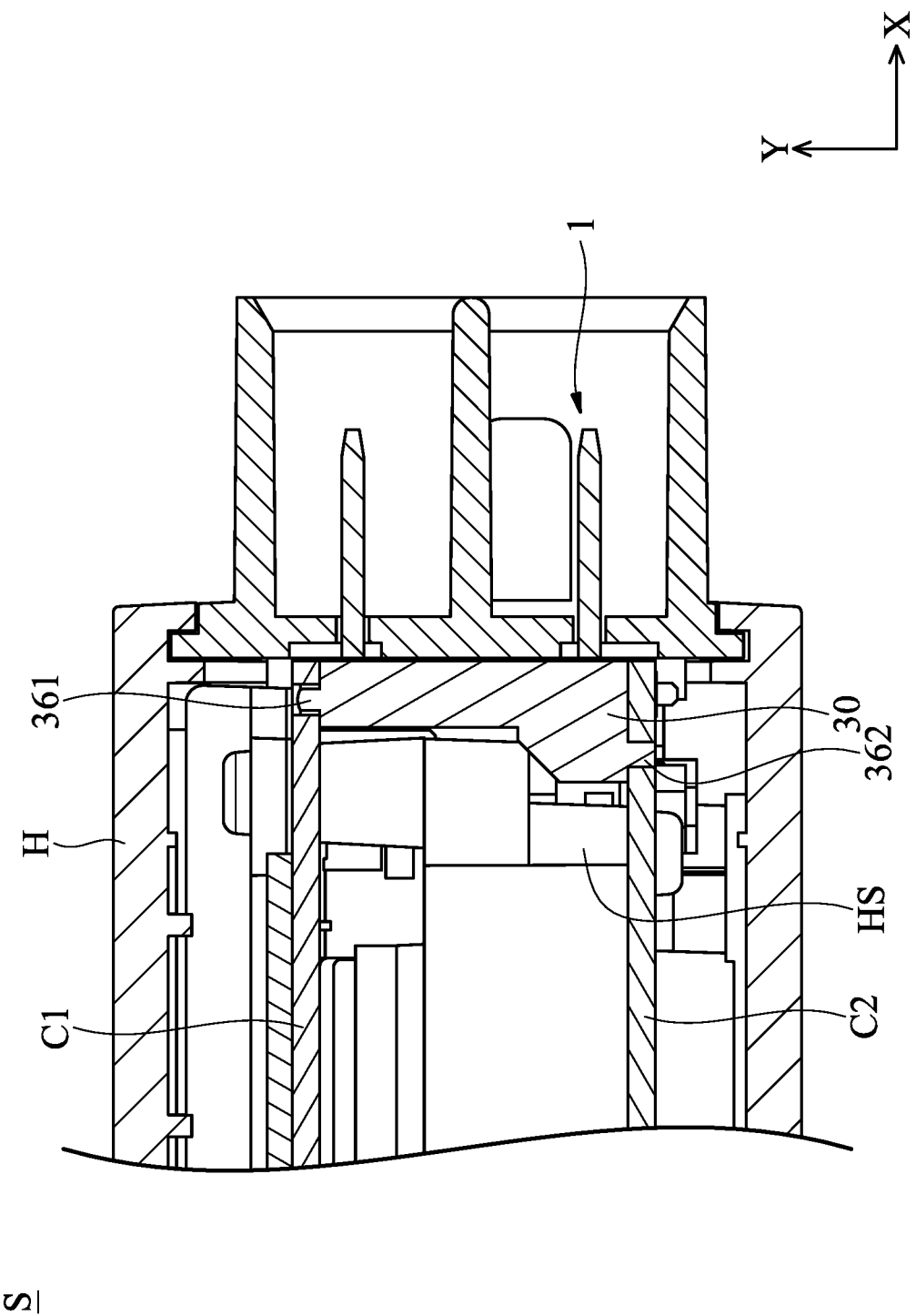
FIG. 2 shows an on-board diagnostic system of the embodiment of the invention.

FIG. 2 shows an on-board diagnostic system S of the embodiment of the invention. The on-board diagnostic system S includes the on-board diagnostic connector terminal 1, a housing H, a first circuit board C1, a second circuit board C2 and a heat sink HS. The heat sink HS is disposed on the second circuit board C2. The substrate 30 is sandwiched between the first circuit board C1 and the second circuit board C2. The first soldering ends 102 and the second soldering ends 202 are coupled to the second circuit board C2. The first positioning protrusions 361 are inserted into the first circuit board C1, and the second positioning protrusions 362 are inserted into the second circuit board C2.

According to the embodiment above, having the first positioning protrusions 361 inserting into the first circuit board C1, and the second positioning protrusions 362 inserting into the second circuit board C2, the on-board diagnostic connector terminal 1 can be firmly affixed in the on-board diagnostic system S.

In one embodiment, the substrate 30 abuts the heat sink HS to further decrease the size of the on-board diagnostic system S. The substrate 30 can be made of plastic. The first pins 10 and the second pins 20 are partially embedded in the substrate 30. The substrate 30 therefore prevents the first pins 10 and the second pins 20 from being electrically connected to the heat sink HS.

With reference to FIG. 3, in one embodiment, the embodiment of the invention provides a method for manufacturing an on-board diagnostic connector terminal, including the following steps. First, a plurality of first pins are provided. Each first pin is integrally formed, each first pin comprises a first section and a second section, the first section is connected and perpendicular to the second section, the first section comprises a first connection end, and the second section comprises a first soldering end (S1). Next, a plurality of second pins are provided. Each second pin is integrally formed, and each second pin comprises a second connection end and a second soldering end (S2). Then, a mold is provided. The mold comprises a plurality of abutting pins, the first pins and the second pins are partially clipped in the mold, and the abutting pins hold the second sections (S3). Next, the first pins and the second pins are embedded in a substrate by injection molding, wherein the first soldering ends and the second soldering ends are arranged on a first straight line (S4). Then, the mold is removed from the substrate. As a result, the abutting pins form a plurality of openings on the substrate while the abutting pins, i.e. the mold, have been removed (S5).

Figure 4A:
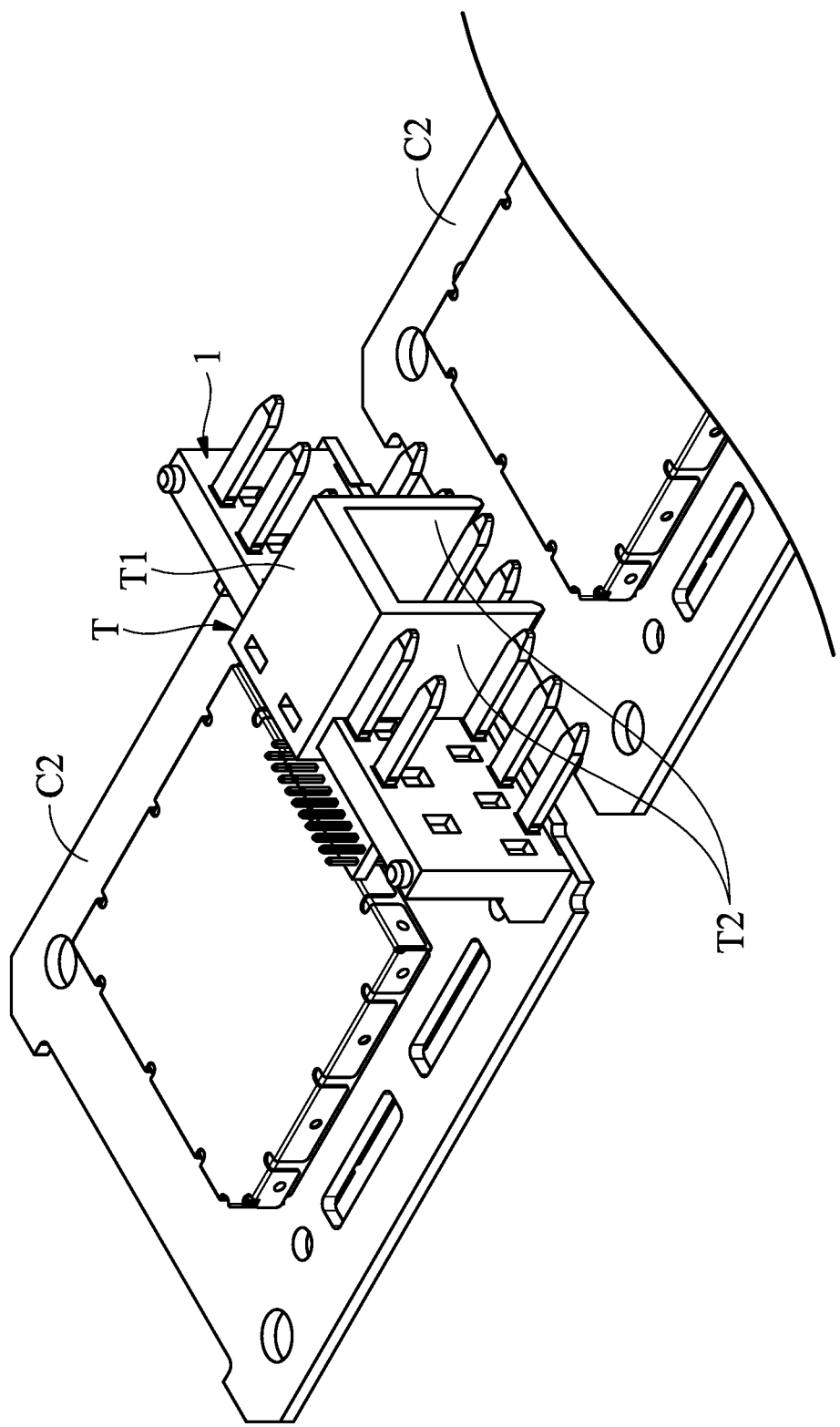
FIG. 4A is a perspective view of the accessory member of the embodiment of the invention combined with the on-board diagnostic connector terminal.
Figure 4B:
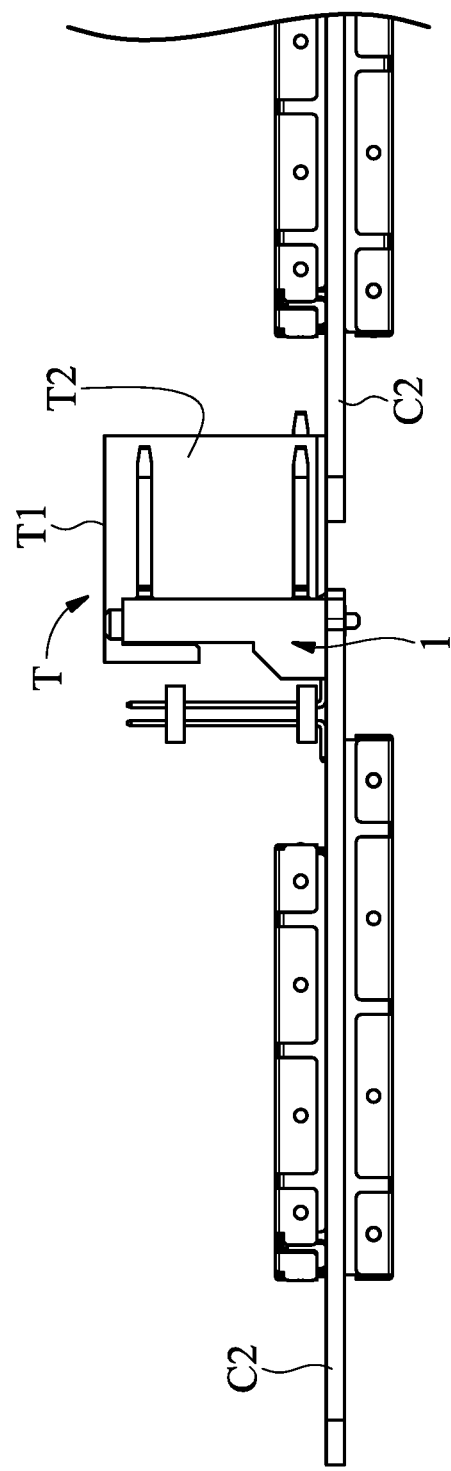
FIG. 4B is a side view of the accessory member of the embodiment of the invention combined with the on-board diagnostic connector terminal.
Figure 4C:
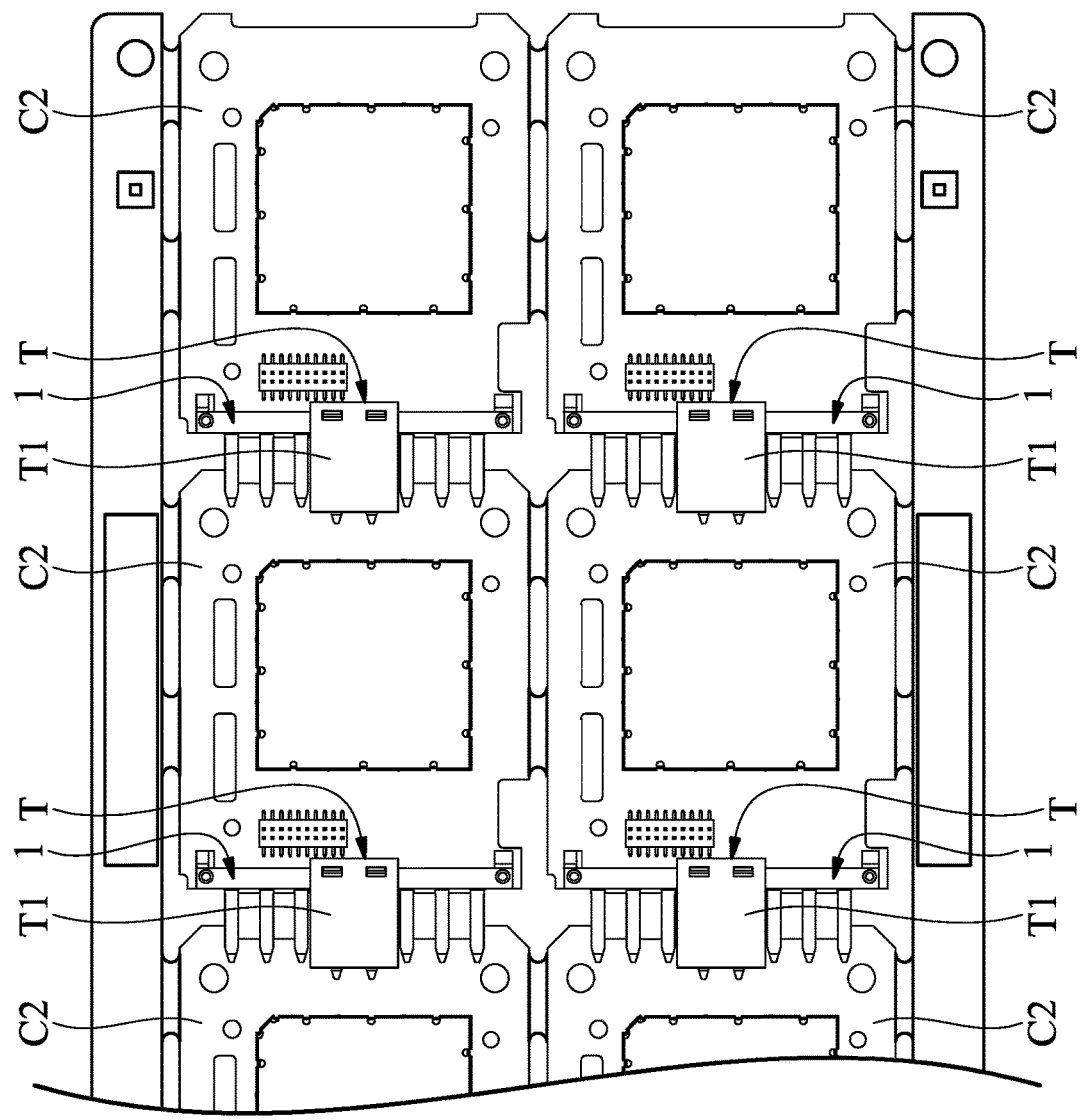
FIG. 4C is a top view of the accessory member of the embodiment of the invention combined with the on-board diagnostic connector terminal.

With reference to FIGS. 4A, 4B and 4C, in one embodiment, the method for manufacturing an on-board diagnostic connector terminal further includes providing an accessory member T, wherein the accessory member T detachably fits with the substrate, the accessory member T comprises a stage T1 and a stand portion T2, and the stage T1 is adapted to be held by a vacuum nozzle (not shown). In one embodiment, the method for manufacturing an on-board diagnostic connector terminal further includes providing a plurality of second circuit boards C2, wherein the first soldering ends 102 and the second soldering ends 202 are soldered to one of the second circuit boards C2, and the stand portion T2 of the accessory member T stands on another second circuit board C2 nearby. The accessory member T can be preassembled to the substrate to support the on-board diagnostic connector terminal 1 on the second circuit board C2 before the on-board diagnostic connector terminal 1 is soldered to the second circuit board C2. After the on-board diagnostic connector terminal 1 is soldered to the second circuit board C2, the accessory member T can be removed. By utilizing the accessory member T, the on-board diagnostic connector terminal 1 can be assembled to the second circuit board C2 by automated processes.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An on-board diagnostic connector terminal, comprising:
    a plurality of first pins, wherein each first pin is integrally formed, each first pin comprises a first section and a second section, the first section is connected and perpendicular to the second section, the first section comprises a first connection end, and the second section comprises a first soldering end;
    a plurality of second pins, wherein each second pin is integrally formed, each second pin comprises a second connection end and a second soldering end, and at least one of the first connection ends and at least one of the second connection ends projected on a first projection plane are aligned along a first direction; and a substrate having each first pin partially embedded therein, and each second pin partially embedded therein, wherein the first soldering ends and the second soldering ends are linearly arranged along a first straight line perpendicular to the first direction, wherein the substrate comprises a first surface and a second surface, the first surface is perpendicular to the second surface, the first connection ends and the second connection ends protrude from the first surface, the first soldering ends and the second soldering ends protrude from the second surface, wherein each second section comprises a first extending portion, a second extending portion and a third extending portion, the first extending portion connects the first soldering end to the second extending portion, the second extending portion connects the first extending portion to the third extending portion, the third extending portion connects the second extending portion to the first section, the first extending portion and the third extending portion extend in the first direction, the second extending portion extends in a second direction, and the second direction differs from the first direction, wherein the substrate comprises a plurality of openings, the second section is exposed in the openings, and at least a portion of the openings are formed on the first surface.

2. The on-board diagnostic connector terminal as claimed in claim 1, wherein the first soldering ends and the second soldering ends are alternately arranged along the first straight line.

3. The on-board diagnostic connector terminal as claimed in claim 1, wherein an extension line of the first extending portion and an extension line of the third extending portion are parallel and separated from each other on the first projection plane.

4. The on-board diagnostic connector terminal as claimed in claim 1, wherein the openings comprise a plurality of first openings and a plurality of second openings, the first openings overlap with the first extending portions on the first projection, and the second openings overlap with the third extending portions on the first projection.

5. The on-board diagnostic connector terminal as claimed in claim 1, wherein at least a portion of the openings are formed on a fourth surface opposite to the first surface.

6. An on-board diagnostic connector terminal, comprising:

a plurality of first pins, wherein each first pin is integrally formed, each first pin comprises a first section and a second section, the first section is connected and perpendicular to the second section, the first section comprises a first connection end, and the second section comprises a first soldering end;

a plurality of second pins, wherein each second pin is integrally formed, each second pin comprises a second connection end and a second soldering end, and at least one of the first connection ends and at least one of the second connection ends projected on a first projection plane are aligned along a first direction; and a substrate having each first pin partially embedded therein, and each second pin partially embedded therein, wherein the first soldering ends and the second soldering ends are linearly arranged along a first straight line perpendicular to the first direction, wherein the substrate comprises a first surface and a second surface, the first surface is perpendicular to the second surface, the first connection ends and the second connection ends protrude from the first surface, the first soldering ends and the second soldering ends protrude from the second surface, wherein the substrate further comprises a third surface opposite to the second surface and at least one first positioning protrusions formed on the third surface.

7. The on-board diagnostic connector terminal as claimed in claim 6, wherein the first positioning protrusions are arranged on a second straight line, and the first straight line is parallel to the second straight line.

8. The on-board diagnostic connector terminal as claimed in claim 7, wherein the substrate further comprises a fourth surface and a plurality of positioning blocks, the fourth surface is opposite to the first surface, the positioning blocks are formed on the fourth surface, each positioning block comprises a second positioning protrusion, the first positioning protrusions protrude in a first protruding direction, and the second positioning protrusions protrude in a second protruding direction opposite to the first protruding direction.

9. The on-board diagnostic connector terminal as claimed in claim 8, wherein the second positioning protrusions are arranged on a third straight line, the first connection ends and the second connection ends protrude toward a third direction, the third direction is perpendicular to the first direction, and the third straight line separates from the second straight line on a second projection plane perpendicular to the first direction.

10. An on-board diagnostic system, comprising:

a housing;

a first circuit board, disposed in the housing a second circuit board, disposed in the housing and spaced apart from the first circuit board; and an on-board diagnostic connector terminal, physically connected to the first circuit board and electrically connected to the second circuit board, the on-board diagnostic connector terminal comprising:

a plurality of first pins, wherein each first pin is integrally formed, each first pin comprises a first section and a second section, the first section is connected and perpendicular to the second section, the first section comprises a first connection end, and the second section comprises a first soldering end;

a plurality of second pins, wherein each second pin is integrally formed, each second pin comprises a second connection end and a second soldering end, and at least one of the first connection ends and at least one of the second connection ends projected on a first projection plane are aligned along a first direction; and a substrate having each first pin partially embedded therein, and each second pin partially embedded therein, wherein the first soldering ends and the second soldering ends are arranged along a first straight line perpendicular to the first direction and coupled to the second circuit board.

11. The on-board diagnostic system as claimed in claim 10, wherein a gap is formed between one of the first connection ends and the second connection end corresponding thereto, the portion of the second section embedded inside the substrate has an embedded length, and the embedded length is greater than the gap.

12. The on-board diagnostic system as claimed in claim 10, wherein the substrate comprises a plurality of openings, and the second section is exposed in the openings.

13. The on-board diagnostic system as claimed in claim 12, wherein the openings comprise a plurality of first openings and a plurality of second openings, the first openings correspond to the first extending portions, and the second openings correspond to the third extending portions.

14. The on-board diagnostic system as claimed in claim 10, wherein the substrate further comprises a third surface opposite to the second surface, and a fourth surface opposite to the first surface, wherein a plurality of first positioning protrusions are formed on the third surface and arranged on a second straight line, parallel to the first straight line, and a plurality of positioning blocks are formed on the fourth surface, each positioning block comprises a second positioning protrusion, the first positioning protrusions protrude in a first protruding direction, and the second positioning protrusions protrude in a second protruding direction opposite to the first protruding direction.

15. The on-board diagnostic system as claimed in claim 14, further comprising a heat sink disposed on the second circuit board and adjacent to the substrate, the substrate is sandwiched between the first circuit board and the second circuit board, the first positioning protrusions are inserted into the first circuit board, and the second positioning protrusions are inserted into the second circuit board.

* * * * *